United States Patent [19]

Hart, Jr. et al.

[11] Patent Number: 5,377,403
[45] Date of Patent: Jan. 3, 1995

[54] METHOD OF MANUFACTURING A PRESSURE SENSOR ASSEMBLY

[75] Inventors: John M. Hart, Jr.; John M. Matly, both of Kokomo, Ind.

[73] Assignee: Delco Electronics Corp., Kokomo, Ind.

[21] Appl. No.: 103,146

[22] Filed: Aug. 9, 1993

Related U.S. Application Data

[62] Division of Ser. No. 864,262, Apr. 6, 1992, Pat. No. 5,263,241.

[51] Int. Cl.6 .................................. H01R 43/00
[52] U.S. Cl. .................................. 29/827; 29/848; 29/418; 264/272.11
[58] Field of Search ............... 29/418, 827, 831, 621, 29/760, 856, 830, 620, 848; 264/272.11, 262

[56] References Cited

U.S. PATENT DOCUMENTS

| | | | |
|---|---|---|---|
| 3,899,305 | 8/1975 | Hilger et al. | 29/827 X |
| 3,913,195 | 10/1975 | Beaver | 29/418 X |
| 4,102,039 | 7/1978 | Henrichson et al. | 29/593 |
| 4,295,117 | 10/1981 | Lake et al. | 338/4 |
| 4,401,053 | 8/1983 | Riley | 118/721 |
| 4,466,183 | 8/1984 | Burns | 29/827 |
| 4,715,118 | 12/1987 | Bernard et al. | 29/856 |
| 4,756,193 | 7/1988 | Luettgen | 73/756 |
| 4,767,984 | 8/1988 | Bakker | 29/760 X |
| 4,820,658 | 4/1989 | Gilber, Jr. et al. | 29/827 X |
| 4,850,227 | 7/1989 | Luettgen et al. | 73/708 |
| 5,085,362 | 2/1992 | Art et al. | 29/60 X |
| 5,228,192 | 7/1993 | Salatino | 29/827 |

Primary Examiner—Timothy V. Eley
Assistant Examiner—Khan V. Nguyen
Attorney, Agent, or Firm—Cary W. Brooks; Mark A. Navarre

[57] ABSTRACT

A carrier frame has cells with inwardly extending thin flexible tabs. Pressure sensor housings are molded into the frame cells such that only the tips of the tabs penetrate the housing wall and after processing the housings are readily pushed out of the frame. A lead frame is insert molded at the same time. During molding the cells of the frame are open ended and after molding a reinforcing tie bar is attached across the open side of the frame to close the cells. A flange is bent up on the opposite side to lend rigidity to the frame. Preformed code flags are provided in the frame and selectively bent out for coding.

3 Claims, 3 Drawing Sheets

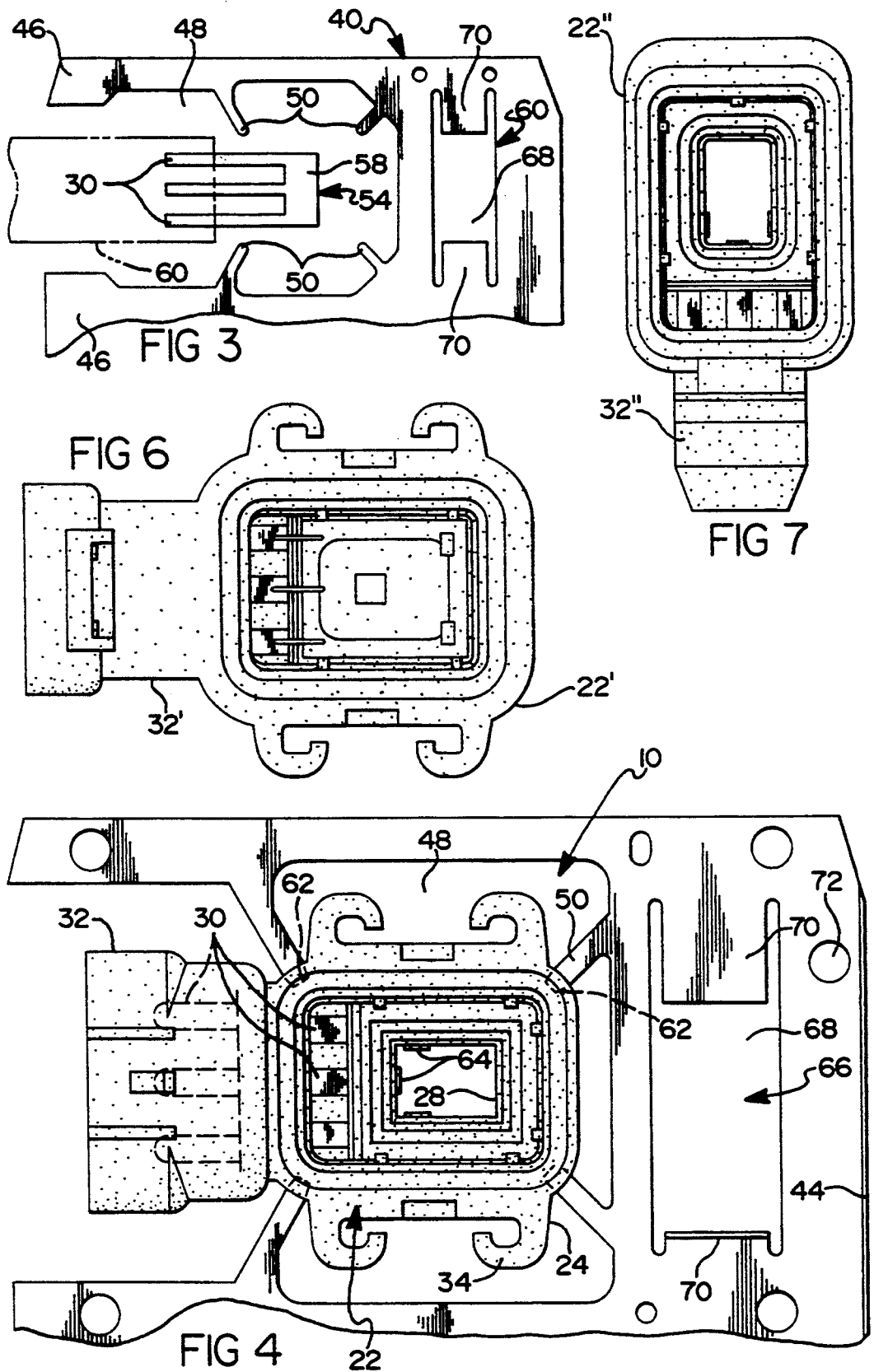

METHOD OF MANUFACTURING A PRESSURE SENSOR ASSEMBLY

This is a division of application Ser. No. 07/864262 filed on Apr. 6, 1992, is now U.S. Pat. No. 5,263,241.

FIELD OF THE INVENTION

This invention relates to the manufacture of pressure sensors and particularly to carrier frames and the use of carrier frames in the manufacture of pressure sensors.

BACKGROUND OF THE INVENTION

Pressure sensors are used in automotive vehicles for a variety of purposes, such as for sensing the pressure at the intake manifold of a vehicle engine, as well as for other applications. Generally, such pressure sensors contain a pressure sensitive element such as a piezoresistive silicon element which is integrated with appropriate adjusting circuitry in a monolithic silicon integrated circuit. Usually, the pressure sensing element is connected to another integrated circuit or to a hybrid circuit which is adjustable by laser trimmable resistors to compensate for manufacturing variations and to condition the output signal to conform to required specifications. Such pressure sensors and their manufacture are disclosed in U.S. Pat. No. 4,850,227 to Luettgen et al entitled "Pressure Sensor and Method of Fabrication Thereof", and the U.S. patent application Ser. No. 07/795,866 to Matly et al entitled "Pressure Sensor and Method for Assembly of Same", which is assigned to the assignee of the present invention and which is incorporated herein by reference.

Such sensors, particularly when used for automotive purposes are generally made in high volumes with automated equipment and indeed, must have high volumes to justify the cost of the specialized equipment. To efficiently handle the sensors in a work station and to move them between stations it is desirable to combine them into groups which are held together by a carrier. It is known to manage the assembly of electronic packages by use of a carrier frame which is molded to several packages and is used to transport the packages within and between work stations. When the assembly is complete, the carrier frame is severed from the packages, leaving part of the frame in the packages. It is desireable to handle the packages in groups without the requirement of the severing step and without the inclusion of extraneous parts within the package.

There are some families of low volume sensors which have a combined high volume, and thus could be made economically if they could be manufactured on the same equipment. Such sensors are similar in many respects but due to different package shapes each member of the sensor family may require specialized handling apparatus and holding apparatus at every stage of manufacture. It is thus desirable to provide a way to manage the handling of such sensors without special handling equipment for each package shape.

SUMMARY OF THE INVENTION

It is therefore an object of the invention to provide a carrier for the manufacture of pressure sensors which securely holds sensor housings without becoming a part of the final sensor package. It is another object to provide such a carrier which accommodates pressure sensors of different package configurations. Another object is to provide a method of manufacturing a pressure sensor which temporarily incorporates a lead frame into the sensor package for assembly and processing and finally removes it completely from the package.

The invention is carried out by apparatus for supporting a plurality of molded housings during the manufacture of pressure sensors comprising: a carrier frame having openings defining a plurality of cells; integral tabs extending from the frame into each cell for inclusion into a sensor housing during a molding step, the tabs being sufficiently strong to securely hold the housing during pressure sensor assembly and processing steps and being sufficiently deformable to permit the housing to be pushed out of the frame.

The invention is further carried out by a method of manufacturing a pressure sensor having a molded housing with a peripheral wall and electrical circuits in the housing comprising the steps of: providing a carrier frame having a plurality of cells and deformable tabs extending into each cell; molding a housing in each cell such that only the tip of each deformable tab protrudes partially into the peripheral wall; moving the carrier frame and housings to a plurality of assembly and processing stations for addition of other sensor parts to the housings and for circuit processing; and separating the housings from the carrier frame by pushing the housings out of the carrier frame such that the deformable tabs completely pull out of the housings leaving only dimples in the peripheral walls.

BRIEF DESCRIPTION OF THE DRAWINGS

The above and other advantages of the invention will become more apparent from the following description taken in conjunction with the accompanying drawings wherein like references refer to like parts and wherein:

FIG. 3 is a plan view prior to molding of a portion of a carrier frame and a lead frame according to the invention;

FIG. 4 is a plan view of a portion of a carrier frame with a sensor housing molded in place according to the invention;

FIGS. 6 and 7 are plan views of alternate housing configuration which could be accommodated by the carrier frame of FIGS. 2-4.

DESCRIPTION OF THE INVENTION

The ensuing description is specifically directed to a carrier frame for and the manufacture of one particular family of pressure sensor packages, it will be understood that the invention is applicable to other sensor configurations as well. For example, the pressure sensor illustrated in the above mentioned U.S. Pat. No. 4,850,227 is also well suited to use with this invention.

Figure 1:
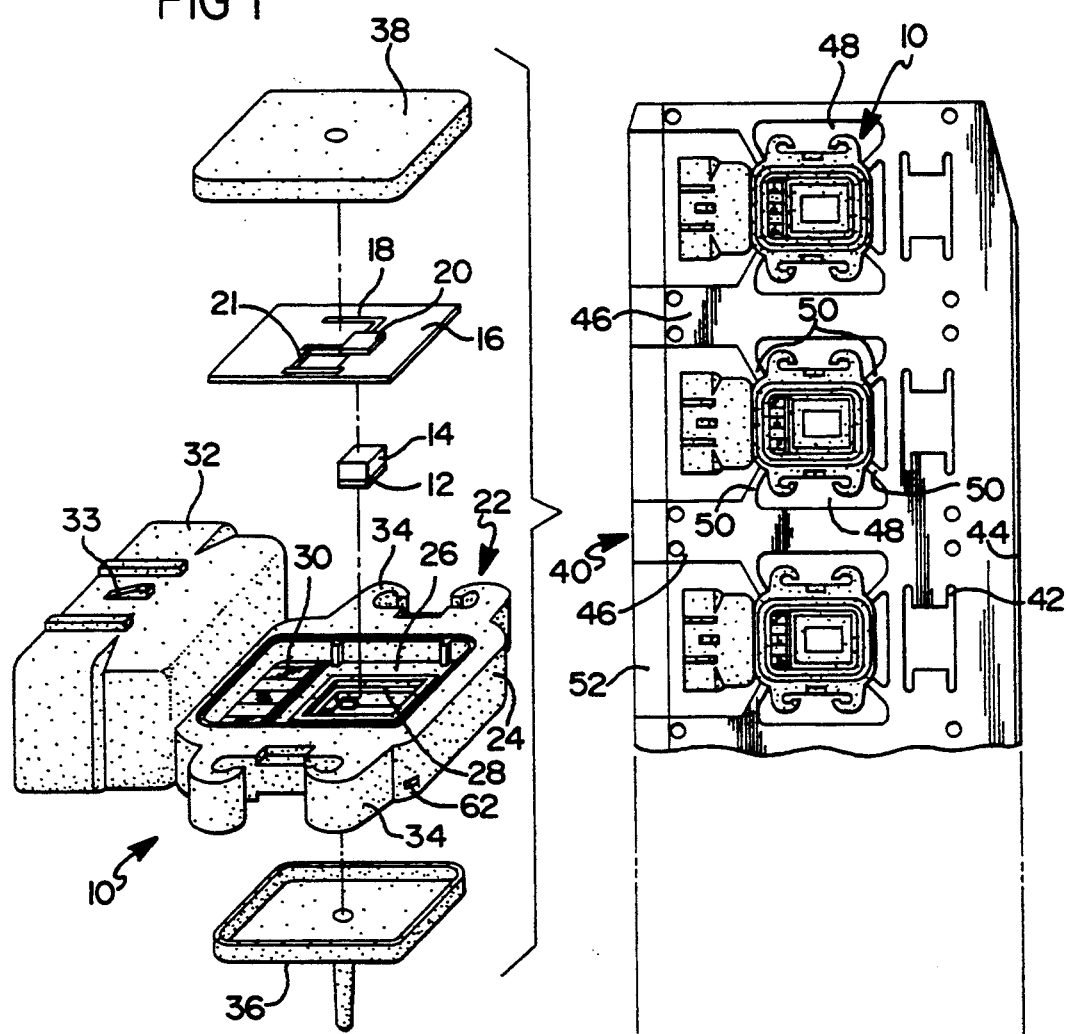
FIG. 1 is an exploded view of a typical pressure sensor being made by the method of the invention.

Referring to FIG. 1, the pressure sensor 10 shown in exploded view has at its heart a pressure sensitive integrated circuit 12 which is bonded to a pyrex cube which together comprise a pressure die 14 which is adhered to the under side of an alumina substrate 16. Thick film circuitry 18 on both sides of the substrate and connected by through holes, not shown, is coupled to the pressure sensitive circuit 12. The upper surface of the substrate 16 contains an integrated circuit amplifier 20 as well as one or more laser trimmable thick film resistors 21. A housing 22 comprises a peripheral wall 24, an inner ledge 26 contained within the wall and defining an inner opening 28, terminal leads 30 sharing space on one side of the ledge 26 and extending into a connector body 32 which protrudes from one side of the wall 24, and two pairs of hook-like mounting flanges 34 protruding from two other sides of the wall 24. A connector lock 33 extends above the top surface of the connector body 32.

The substrate is assembled to the housing by adhesively securing the substrate margin to the ledge 26. The pressure die 14 is applied to the bottom of the substrate through the opening 28 and the circuit 12 is wire bonded to the circuitry 18. A ported bottom cover 36 is adhesively secured to the bottom of the housing wall 24 to define a lower pressure chamber bounded at the top by the substrate 16. Prior to closing the upper part of the housing by an upper cover 38, several processing steps are necessary to calibrate the pressure sensor and to protect the circuit. For calibration, functional circuit tests are performed and the circuit is laser trimmed first at one temperature and then repeated at another temperature as is well known in the art. Circuit protection may include passivication for example by high temperature vulcanizing silicone gel. Additional details of the assembly are provided in the above identified application U.S. Ser. No. 07/795,866.

Figure 2:
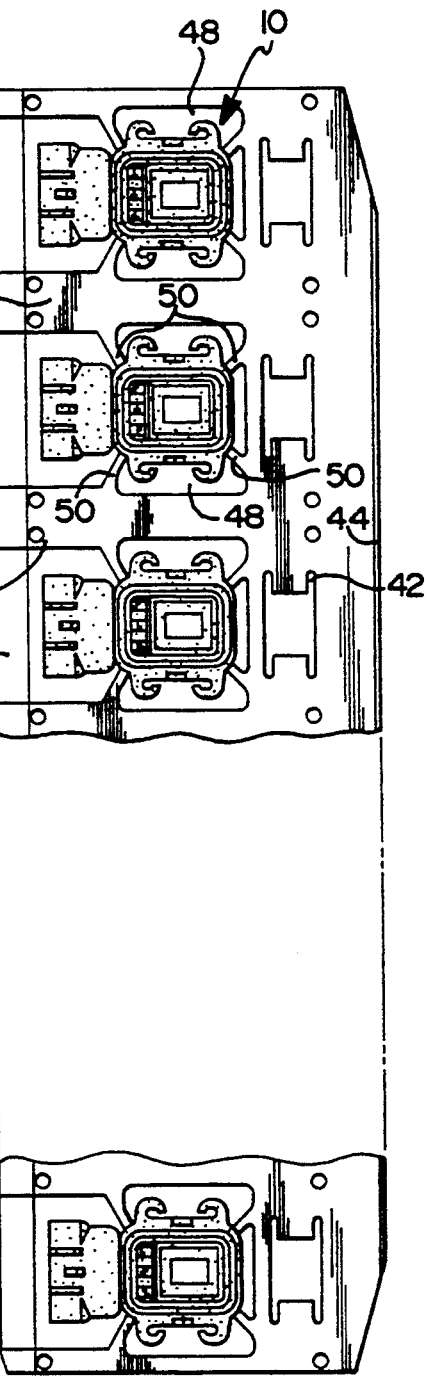
FIG. 2 is a plan view of a complete carrier frame holding a plurality of sensor housings according to the invention.

Referring now to FIG. 2, a carrier frame 40 is used to hold several pressure sensors 10 and carry them through the various assembly and processing stations. The frame 40 is a steel stamping mainly comprising an elongated base 42 at one side with an upturned flange 44 along its edge for adding rigidity, a plurality of spaced fingers 46 extending laterally from the side of the base 42 opposite the flange 44 so that the spaces between the fingers define cells 48 for containing housings 22, long thin tabs 50 extending from the base and fingers into the cells for holding the housings 22, and a tie bar 52 which is a separate member added to the frame after the molding operation by attaching to the ends of the fingers 46.

Additional features of the lead frame which enhance its utility in the assembly of the pressure sensors include an H-shaped opening 66 in the base aligned with each cell 48, thus forming a row of openings 66 parallel to the flange 44 of the carrier frame. The center of the opening is a cutout 68 and the ends of the H-shape define code tabs or flags 70 on either side of the cutout 68. In FIG. 4 one of the flags is shown bent up normal to the plane of the carrier frame 40. The flag or flags to be bent up are selected according to a code indicative of the type of pressure sensor being manufactured or desired processing steps. Between the row of openings 66 and the flange 44 a code hole 72 is formed in the frame for a purpose similar to that of the flags. The hole 72 is positioned according to a code. The positions of the hole 72 and of the flags 70 are read by decoding apparatus at subsequent work stations to control the operation at a given station. The inclusion of two code schemes allows for much information to be available to the work stations. The information can be used, for example, to designate the type of circuit to be installed, the location of test points on the substrate, or the location of trimmable resistors.

The carrier frame 40 is formed of 0.015 inch thick cold rolled steel. Its contour and apertures are formed in a continuous length strip by progressive dies and it is cut into the desired lengths according to the number of cells required. The cuts are made through a finger 46 portion so that the end fingers on each frame are narrower and weaker than the intermediate fingers. The strengthening function of the tie bar is sufficient to overcome this weakness. By cutting the strip through the fingers, the resulting frames, when aligned end-to-end for conveyance through successive work stations, will hold the housings in equally spaced positions.

FIG. 3 is a view of a portion of the carrier frame 40 just prior to the molding step and since the tie bar 52 has not yet been attached to the frame the cells 48 are open ended. The carrier frame remains flat during the molding step. FIG. 3 includes a lead frame 54 shown in position in the cell 48 ready for insert molding. The lead frame comprises three terminal leads 30 joined at their inner ends by a common base 58 which is removed by a stamping operation after molding. The lead frame 54 is held in position by molding apparatus 60 which extends through the open end of the cell in the carrier frame.

The molding step is carried out by a multicavity mold, not shown, which closes around the lead frame and the carrier frame, and housing material is injected into the cavities to form a housing 22 in each cell. As best shown in FIG. 4, only the tips of the tabs 50 enter the housing wall 22 to form small indentations or dimples 62 which do not penetrate through the wall or violate the cavity formed within the wall 22. The terminal leads 30 are embedded in the housing with areas exposed within the housing for the attachment of wire leads, and with their outer terminal portions extending into the connector body 32. As shown in FIG. 4, the common base of the terminals has already been removed and the cut edges 64 of the terminals 30 show at the sides of the opening 28.

After the housings have been formed by molding and the carrier 40 has been removed from the molding station, the flange 44 is formed on the edge of the carrier, at least one flag 70 is bent up to identify required processing steps, a hole 72 is punched to identify the part, and the tie bar 52 is attached to the outer ends of the fingers 46 in any manner such as by welding, riveting or crimping. The reinforcement of the frame 40 by the tie bar lends sufficient strength to carry the housings through the various work stations for assembly and processing. Even though the carrier frame 40 is strong, the housings are readily removed from the frame at the end of assembly by pushing them out of the plane of the frame. Since only the tips of the tabs 50 engage the housing and the tabs are long and thin, the tabs are deformable and pull out of the dimples 62 when the housings are pushed out. The tabs are typically 9 to 11 mm long and 2 mm wide, and the tips extend into the housing wall 24 only about 1 mm.

As indicated above, the carrier frame 40 transports the parts from one station to another by conveyor, but in some cases the frames are loaded into cartridges by stacking for transport to another location. This facilitates movement within a plant as well as between plants. It is sometimes desirable, for example, to make the carrier frame and mold the housings onto the frame at one site and perform subsequent steps at another site.

Figure 5:
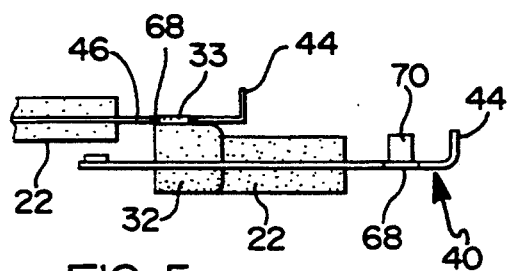
FIG. 5 is an end view of stacked frames and sensor housings.

The purpose of the cutouts 68 is to allow staggered or overlapping stacking of the frames 40 and housings 22. As shown in FIG. 5, one frame can be positioned above another such that the connector lock 33 of each lower housing 22 protrudes through the cutout 68 of the next higher frame 40. In this way the assemblies easily stack and hold their positions and can be stacked several layers high. Because the distance between the cutout 68 and the adjacent flange 44 is small, the flange edge of the frame overhangs the housing 22 beneath by an amount insufficient to obscure the housing cavity which contains the substrate 16. By stacking the frame/housing assemblies the housings can be arrange in a high density array which is especially suitable for certain batch processes, for example those requiring heating in a confined space.

Figure 8:
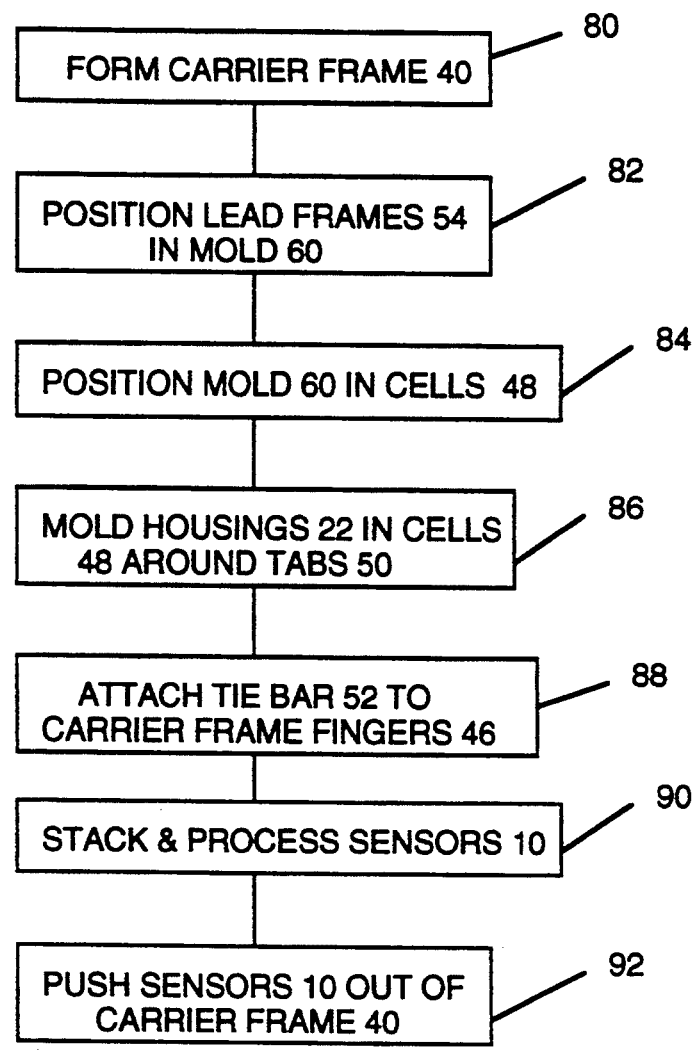
FIG. 8 is a process flow diagram of the steps for manufacturing molded housing pressure sensors according to this invention.

The foregoing process steps are summarized in the process flow diagram of FIG. 8. Block 80 designates the step of forming the carrier frame 40; block 82 designates the step of positioning lead frames 54 in the mold 60; block 84 designates the step of positioning the multicavity mold 60 in respect to the carrier frame 40 so as to mold sensor housings 22 within the cells 48; block 86 designates the molding step at which the housing material is injected into the mold cavities; block 88 designates the step of attaching tie bar 52 to the carrier frame fingers 46 after removal of the mold 60; block 90 designates the step of stacking the carrier frames 40 for various batch processing operations; and block 92 designates the step of pushing the sensors 10 out of the carrier frames 40 upon completion of the processing operations.

An inspection of FIG. 4 will reveal that the design of the frame 40 mandates four specific engagement points where the tabs 50 enter the dimples 62 of each housing 22. Otherwise the cell 48 is somewhat larger than the housing and allows freedom of design of the housing except for the location of engagement points. The frame 40 then can be used without alteration for housings of different shapes. FIG. 6 illustrates an alternately shaped sensor housing 22' which is similar to that of FIG. 4 but has a narrower and longer connector body 32'. FIG. 7 shows still another housing 22'' which lacks the mounting flanges of FIG. 4 and has a much smaller connector body 32''. In each case, the engagement points on the housing must be the same. The circuitry in each housing or the housing internal structure may be the same or different.

The embodiments of the invention in which an exclusive property or privilege is claimed are defined as follows:

1. A method of manufacturing pressure sensors each having a molded housing with a peripheral wall and electrical circuits in the housing comprising the steps of:
   forming a carrier frame having a plurality of cells and deformable tabs extending into each cell, each cell being open at one side of the carrier frame to accomodate molding apparatus;
   molding a housing in each cell such that a portion of each deformable tab protrudes into the peripheral wall;
   after molding the housing in the cells, attaching a tie bar across the open sides of the cells to reinforce the frame;
   moving the carrier frame and housings to a plurality of assembly and processing stations for addition of other sensor parts to the housings and for circuit processing to complete pressure sensor assembly; and
   separating the housings from the carrier frame by pushing the housings out of the carrier frame such that the deformable tabs completely pull out of the housings leaving only dimples in the peripheral walls.

2. A method of manufacturing pressure sensors each having a molded housing with a peripheral wall and electrical circuits in the housing comprising the steps of:
   forming a carrier frame having a plurality of cells and deformable tabs extending into each cell, the carrier frame being generally planar and having a base at one side and fingers extending laterally from the base to define the cells,
   forming a plurality of code tabs in the base and in the plane of the base;
   encoding the carrier frame with product and processing data by selectively bending code tabs from the plane of the base and by forming holes in selected portions of the base;
   molding a housing in each cell such that a portion of each deformable tab protrudes into the peripheral wall;
   moving the carrier frame and housings to a plurality of assembly and processing stations for assembling and processing the sensors at the stations in accordance with the encoded information; and
   separating the housings from the carrier frame by pushing the housings out of the carrier frame such that the deformable tabs completely pull out of the housings leaving only dimples in the peripheral walls.

3. A method of manufacturing pressure sensors each having a molded housing with a peripheral wall comprising the steps of:
   forming a generally planar carrier frame having a base at one side, fingers extending laterally from the base to define a plurality of cells, and deformable tabs extending into each cell,
   molding a housing in each cell such that a portion of each deformable tab protrudes into the peripheral wall, each housing having a portion protruding out of the plane of the carrier, the base having cutouts dimensionally corresponding to protruding housing portions;
   stacking the carriers and sensors in an overlapping array with the protruding housing portions of one set nesting in the dimensionally corresponding cutout in the base of an adjacent carrier frame to thereby establish a high density array of pressure sensors;
   moving the carrier frames and housings to a plurality of assembly and processing stations so as to batch process the pressure sensors while stacked in a high density array; and
   separating the housings from the carrier frames by pushing the housings out of the carrier frames such that the deformable tabs completely pull out of the housings leaving only dimples in the peripheral walls.

* * * * *